United States Patent
Coico et al.

(10) Patent No.: US 6,339,534 B1
(45) Date of Patent: Jan. 15, 2002

(54) COMPLIANT LEADS FOR AREA ARRAY SURFACE MOUNTED COMPONENTS

(75) Inventors: Patrick A. Coico, Fishkill, NY (US); Luc Guerin, Granby (CA)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/434,269

(22) Filed: Nov. 5, 1999

(51) Int. Cl.[7] .................................................. H05K 7/02
(52) U.S. Cl. ........................................ 361/760; 361/777
(58) Field of Search ................................ 361/760, 772, 361/777, 785, 787, 789

(56) References Cited

U.S. PATENT DOCUMENTS

| | | | | |
|---|---|---|---|---|
| 3,795,845 A | * | 3/1974 | Cass et al. | 317/234 R |
| 4,549,036 A | * | 10/1985 | Reichbach | 174/52 FP |
| 4,640,499 A | * | 2/1987 | Hemler et al. | 267/160 |
| 4,703,393 A | * | 10/1987 | Yamamoto et al. | 361/405 |

* cited by examiner

Primary Examiner—Brian Sircus
Assistant Examiner—Son V. Nguyen
(74) Attorney, Agent, or Firm—Steven Capella

(57) ABSTRACT

An area array integrated circuit package having contact pads is provided with compliant rectangular shaped connection leads each attached to a contact pad. The leads are arranged and oriented on the surface of the package around the neutral point of the package such that the flat width dimension of each lead faces the neutral point of the contact array, thereby offering optimal compliance against thermally induced deformation and resulting in improved interconnection reliability.

14 Claims, 4 Drawing Sheets

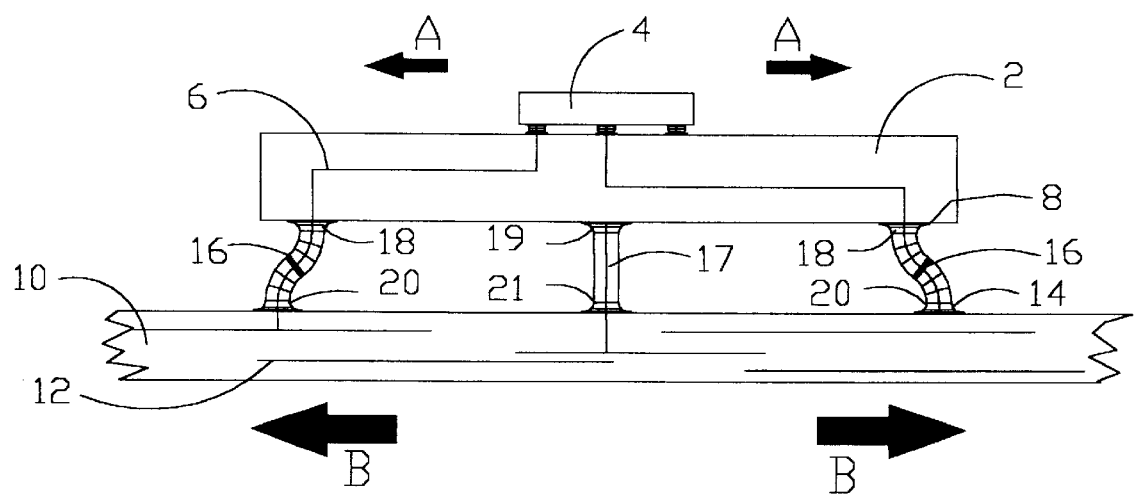
FIGURE_1
PRIOR ART
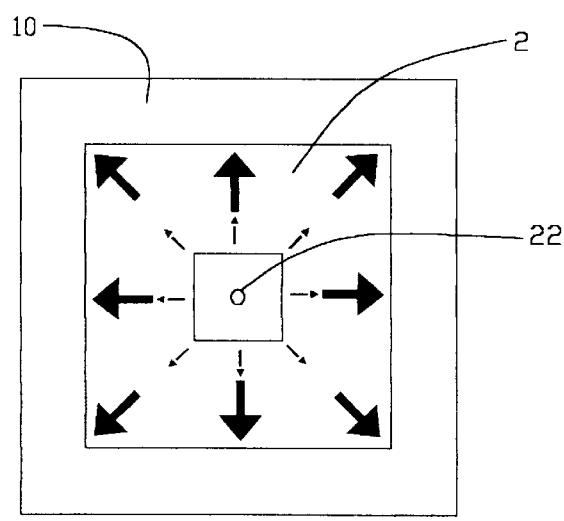
FIGURE_2
PRIOR ART

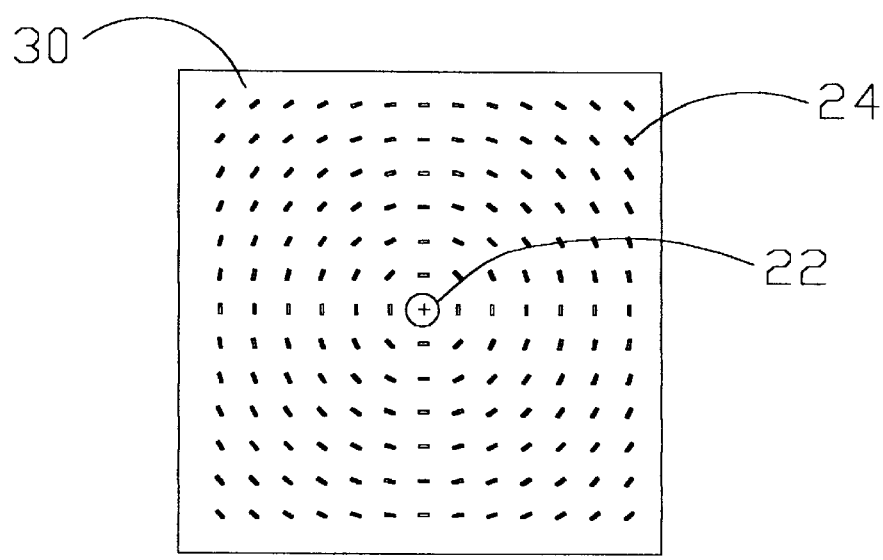
FIGURE_5
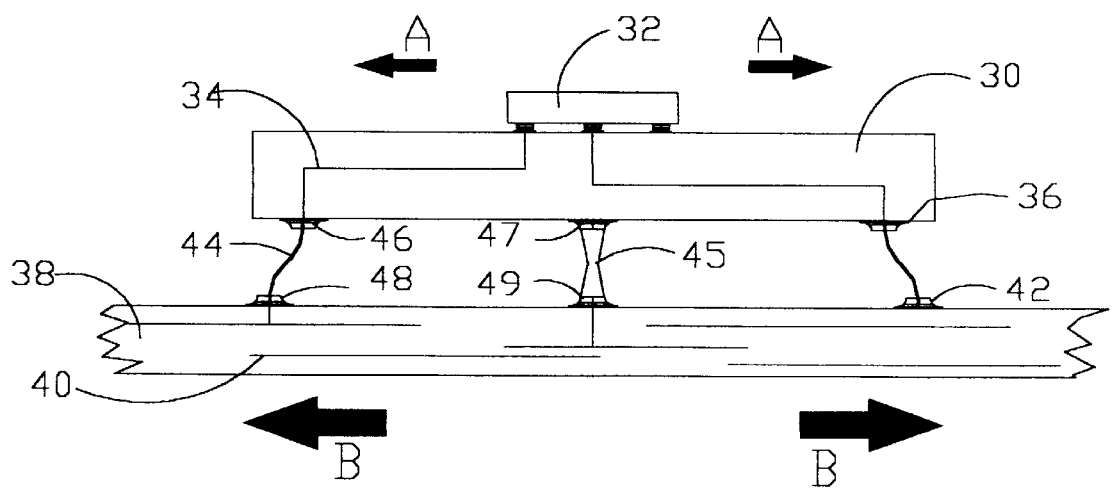
FIGURE_6

COMPLIANT LEADS FOR AREA ARRAY SURFACE MOUNTED COMPONENTS

FIELD OF THE INVENTION

The present invention generally relates to interconnection elements for interconnecting integrated circuit packages to printed circuit boards in surface mounted area array assemblies, using flat connection elements of particular configurations and arrangements.

BACKGROUND OF THE INVENTION

In the field of integrated circuit packages, area array integrated circuit packages are becoming more and more frequently used. Area array packages include ball grid arrays and column grid arrays. The main advantage of the area array products is the large number of I/O contacts which are provided as the complete bottom surface of the module or package is used, in comparison with the peripheral lead products, which make use of only contact locations adjacent to the periphery of the package. These products are attached to printed circuit boards using established surface mount techniques. Area array packages include packages with either fully or partly populated bottom surfaces.

In preparation for surface mounting on a printed circuit board for example, solder balls or solder columns are permanently attached to the IC package, which in turn are permanently attached to the printed circuit board pads by soldering. The assembled structure includes interconnect elements, for example solder balls, with two solder joints, one to a contact on the package surface, one to a contact on the printed circuit board surface.

One major restriction of the area array interconnection technology is the reliability of the solder joints. An assembled product is subjected to thermal variations with significant stresses resulting in the solder joints because of the difference in thermal expansion between the printed circuit board and the IC package. This results from the differences in the coefficient of thermal expansion of the elements involved. Different factors, including operating temperature of the assembled product, compliance of the interconnection elements, number of thermal cycles, size of the package, package material, have an impact on the amount of resulting stress on the solder joints. Improvements in reliability are needed for the more extreme conditions and critical factors.

One method to reduce stress in the solder joints is to increase the compliance of the interconnection element. For example, instead of using a solder ball, a well-known solution is to use a solder column interconnecting element. Assembled solder ball connections provide short cylindrical interconnections, compared to solder columns which provide much longer cylindrical connections, typically in the order of three times longer. Longer cylindrical connections are more compliant, so lower stress is transmitted to the solder joint.

There are important drawbacks with the use of solder column interconnections. With longer connection elements, the resulting product is more susceptible to damage resulting from handling. Longer elements result in an increase of the self-inductance of the connections, which is detrimental to the electrical performance of the IC package. It would be preferable to use a connection element that is more compliant than solder ball but with a length equivalent to a solder ball.

Flat leads can be more compliant than cylindrical connections such as balls or columns. In the past, flat leads have been used extensively as interconnection elements in peripherally connected products such as quad flat packs. U.S. Pat. No. 5,647,124 which issued Jul. 15, 1997 to Chan et al entitled "Method of Attachment of a Semiconductor Slotted Lead to a Substrate"; U.S. Pat. No. 4,647,126 which issued Mar. 3, 1987 to Sobota entitled "Compliant Lead Clip"; and U.S. Pat. No. 5,317,479 which issued May 31, 1994 to Pai et al, entitled "Plated Compliant Lead", provide examples of the use of flat leads in peripheral connection packages. For today's high density IC packages, peripheral connection packages are not practical because they do not offer a sufficient number of I/O connections, because of the inherent configuration where only the outside peripheral area of the packages is used to connect to the printed circuit card.

In the patent literature, there have been some descriptions of the possible use of flat leads in area array packages. U.S. Pat. No. 4,751,199 which issued Jun. 14, 1999 to Phy, entitled "Process of Forming a Compliant Lead Frame for Array-Type Semiconductor Packages" teaches the use of flat leads on an area array IC package. A drawback with this disclosed approach is that all leads are aligned in the same direction. In actual conditions stresses result in directions extending radially outward from the center of the module. Disposition of the leads on the package must be optimized in order to get low stress on the joints and appropriate reliability with a flat lead arrangement on an area array package. These are some of the shortcomings of this reference subsequently addressed by the subject invention.

U.S. Pat. No. 5,420,461 which issued May 30, 1995 to Mallik et Al., entitled "Integrated Circuit Having a Two-Dimensional Lead Grid Array" shows a configuration very similar to what is disclosed in Phy, and suffers from the same drawbacks. The leads are all aligned in the same orientation, which has been found to be not optimal.

Also of interest are the teachings of U.S. Pat. No. 5,490,040 which issued Feb. 6, 1996 to Gaudenzi et al and entitled "Surface Mount Chip Package Having an Array of Solder Ball Contacts Arranged in a Circle and Conductive Pin Contacts Arranged Outside the Circular Array". The point of neutral stress of an array is discussed and the recognition that the degree of stress in the leads and contacts in a circuit package radiate from this neutral point. Thus it is proposed in this reference that ball contacts should only be used up to a certain radial distance from the neutral point, and further out, pin connections should be used in order so that the effects of stress can be minimized.

SUMMARY OF THE INVENTION

It is one object of the present invention to provide an area-array integrated circuit package with increased reliability in the interconnections in the presence of thermal stress.

It is a further object of this invention to provide a new, practical and more reliable compliant interconnection element for interconnecting electronic circuit components.

It is another object of this invention to provide flat, compliant, connecting elements, or leads, which are oriented in an IC package such that each flat lead faces the neutral point of the package. The flat connection elements are aligned in the orientation of optimal compliance and flexibility, thereby offering compliance to thermal variation that is superior to that of commonly used solder balls or columns.

It is another object of the present invention to provide interconnections from one planar substrate to another, where the substrates may be printed circuit boards, ceramic cards, or other substrates common in the field.

According to one aspect of the invention there is provided an integrated circuit package having an array of contacts on a surface of the package and said array of contacts has a neutral point. A plurality of compliant leads is provided such that each lead is connected to one of said contacts on the surface of the package. Each lead extends outwardly from a respective contact on said surface and has a generally rectangular cross-section shape such that each lead has a width dimension and a thickness dimension wherein the width dimension is greater than the thickness dimension. At least some of the leads are arranged and oriented around the neutral point of said array such that the width dimension of said at least some of the leads face the neutral point.

According to another aspect of the invention, there is provided an electronic circuit assembly comprising a first planar component having an array of contacts on one surface such that said array of contacts has a neutral point and a second planar component having array of contacts on one surface thereof such that said array of contacts on the surface of the second planar component correspond to the contacts in said array of contacts on the surface of the first planar component. A plurality of compliant leads is provided such that each contact on the surface of the first planar component is interconnected by a compliant lead to a corresponding contact on the surface of the second planar component. Each compliant lead has a generally rectangular cross-section shape such that each lead has a width dimension and a thickness dimension such that the width dimension is greater than the thickness dimension. At least some of the compliant leads are arranged and oriented between the contact on the surfaces of the first and second planar components around the neutral point such that the width dimension if said at least some of said compliant leads face said neutral point.

Further details and advantages of the invention will be apparent from the following description of the preferred embodiments of the invention, illustrated in the accompanying drawings.

BRIEF DESCRIPTION OF THE DRAWINGS

FIG. 1 is a side cross-sectional view of a prior art IC package assembled on a printed circuit card.

FIG. 2 is a top schematic view of an IC package assembled on a printed circuit card, showing the direction and relative importance of stresses resulting from thermal deformation as known in the prior art.

FIG. 5 is a top view of an IC package according to a preferred embodiment of the invention.

FIG. 6 is a side cross-sectional view of an IC package assembled on a printed circuit card, according to a preferred embodiment of the invention.

DESCRIPTION OF THE PREFERRED EMBODIMENTS

Figure 3:
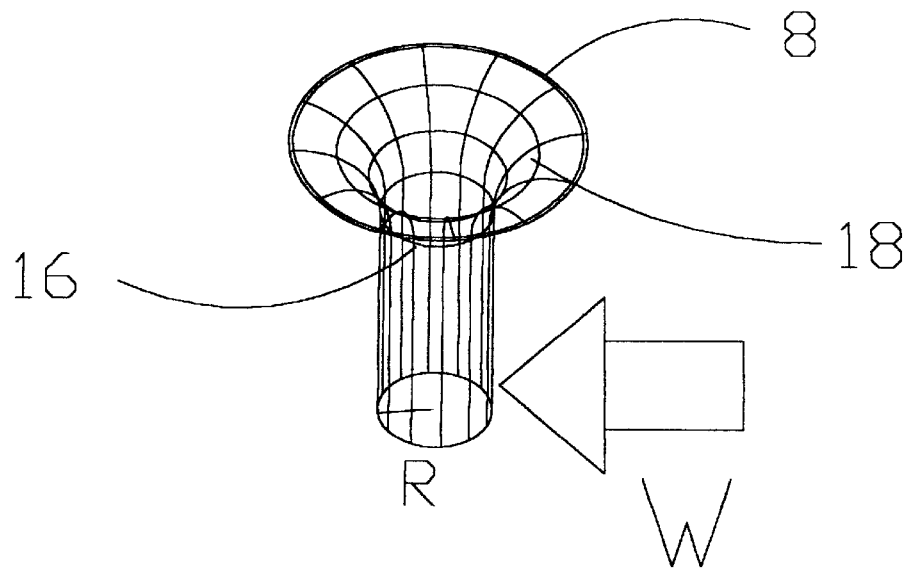
FIG. 3 is an isometric view showing a prior art cylindrical connection element.

Unless a specific element is being referred to, throughout this specification the term "interconnection elements" is used as a general term to represent Wads, solder balls, solder columns, or any such element that can be used to interconnect electronic components and circuit boards or cards. The term "neutral point" of an array refers to the point at which there is no relative motion between the package and card in the horizontal plane, when the assembly is subjected to thermal excursions. It generally corresponds to the geometric center of the array of pads. "Neutral point" is a well known term in the electronic packaging art. For example, the reference Microelectronics Packaging Handbook, Part III, Subsystems Packaging, Copyright© 1997 by Chapman & Hall, New York, N.Y. at page 111–540 refers to "distance to neutral point as the separation of a joint from the neutral point on a chip. This dimension controls the strain on the joint imposed by expansion mismatch between chip and substrate. The neutral point Is usually the geometric center of an array of pads and defines the point at which there is no relative motion of chip and substrate in the X-Y plane during thermal cycling."

Continuing with a description of the prior art in order to subsequently be able to better appreciate the description of the subject invention, FIG. 1 is a side cross-sectional view showing a typical prior art area array IC package assembled on a printed circuit card. FIG. 1 represents the operation of the assembly at elevated temperatures. IC package (2) comprises an integrated circuit chip (4), internal conductive wiring (6) interconnecting chip (4) to a plurality of I/O pads (8). IC package (2) is joined to printed circuit card (10) which includes conductive wiring (12), and a plurality of contact pads (14). Each connection of the package (2) to the card (10) comprises a cylindrical or spherical interconnection element (16 or 17), and a pair of solder joints, namely top solder joints (18 and 19) joining the IC package I/O pads (8) to the connecting elements (16 or 17), and bottom solder joints (20 and 21) joining the card pads (14) to the connecting elements (16 or 17). Arrows A represent schematically the amount and direction of thermal expansion to which the IC package (2) is subjected due to the operation temperature. Arrows B represent the amount of thermal expansion to which the printed circuit card (10) is subjected due to the operation temperature. Arrows B are larger than arrows A, indicating that in this example, circuit card (10) has a higher amount of thermal expansion than the package (2), thereby causing outward deformation in the interconnection elements (16) that are located in external or peripheral regions of package (2), which in turn will transmit stress to the top and bottom solder joints (18 and 20) of elements (16). This stress may eventually break one of the solder joints, thereby causing a failure of the assembly. Also shown is an interconnection element (17) that is generally located at the center of IC package (2). The geometrical central point of the package is generally the position of the neutral point or neutral stress point, and little or no deformation results at this point. The amount of deformation in the leads increases the further a lead is away from the neutral point.

FIG. 1 is intended to be a general representation of the prior art and thus the number, nature and details of the elements may vary without affecting the meaning of the above description.

FIG. 2 shows a top view of the IC package (2) assembled on the card (10) of FIG. 1. The arrows represent the direction and magnitude of the deformation the interconnection elements are subjected to when the assembly is heated during operation. Central neutral point (22) is shown. No deformation results at this point. As shown in FIG. 2, the resulting deformation of the package elements occurs in a specific direction, which is either towards or away from the neutral point.

FIG. 3 shows a cylindrical interconnection element (16) of FIG. 1 of radius R, joined at one end to an IC package I/O pad (8), by a solder joint (18). A horizontally applied force W results in a lateral displacement to the tip of element (16). This force is proportional to the moment of inertia of the cylindrical cross-section of the connecting element. For a cylindrical connection element the moment of inertia (I) is proportional to the radius (R) of the cylinder to the power of 4:

$$I = \frac{Pi * R^4}{4}$$

As we can see from the formula, the moment of inertia, and consequently the transmitted stress increases by a very large amount when the radius R of element (16) is increased. Consequently, unless the radius R of connection element (16) is extremely small, a relatively high moment of inertia results and consequently a relatively rigid interconnection element is obtained. Such rigid interconnection element (16) will transmit significant stress to the solder joint (18).

Figure 4:
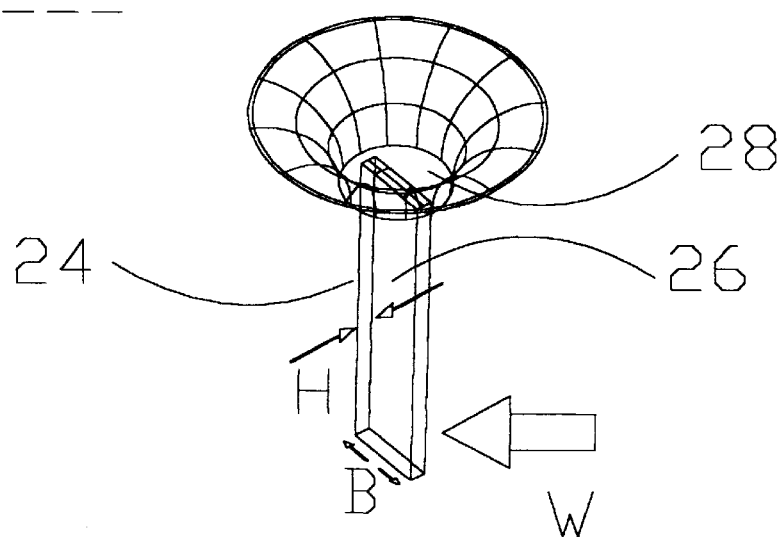
FIG. 4 is an isometric view showing a flat connection element which is a feature of the present invention.

FIG. 4 shows one embodiment of an interconnection element (24) which is the subject of the present invention. Interconnection element has a flat arm (26), and a flat pad (28). Flat arm (26) has thickness H and width B as shown. A force W applied as shown results in a given displacement of the tip of the element (24). Similarly as in the prior art interconnection element, this force is proportional to the moment of inertia of the cross-section of the connecting element. For a rectangular connection element the moment of inertia (I) is proportional to the thickness (H) of the rectangle to the power of 3, and to the width of the rectangle:

$$I = \frac{B * H^3}{12}$$

As can be seen from the formula, the moment of inertia can be controlled to be a low amount by maintaining a small thickness (H) of the element, even if the width (B) is relatively large. By using fabrication methods for sheet metal, it is relatively straightforward to manufacture flat elements having a low moment of inertia. Consequently the stress transmitted to the solder joint is reduced by a significant amount compared to the prior art cylindrical or spherical connection elements. We notice that, in order to have a low moment of inertia, force W has to be applied in a perpendicular direction with respect to the flat arm (26) of the connection element (24) as shown in FIG. 4. In other words, the force should be applied to the side of the arm having the width (B) dimension as opposed to being applied to the side having the thickness (H) dimension. The dimension of width (B) is greater than the dimension of thickness (H).

For additional understanding of the forces and resulting deformation on various shapes of interconnecting elements, reference may be made to the textbook Mechanics for Engineers, Statics, Copyright© 1976 by McGraw-Hill, inside back cover page.

FIG. 5 shows a top view of an IC package (30) representative of an aspect of the present invention, showing the tips of the rectangular connection elements (24) which could be similar to the elements described in FIG. 4. As shown, the connection elements (24) are positioned on and attached to contacts on the IC package (30). Flat arms of the elements (24) are oriented in a perpendicular orientation with respect to the forces resulting from the thermal deformations. Consequently, leads are oriented on the package such that the flat arm of each lead faces the neutral point or neutral stress point (22) of the array. Thus each of the rectangular elements (24) have a width dimension which is greater than a thickness dimension as described with respect to the rectangular shaped interconnection element in FIG. 4. As can be seen from FIG. 5, not every lead is oriented in the same direction. The orientation of the leads varies depending upon where the leads are located on the surface of the package. The leads are arranged and oriented around the neutral point of the array in such a manner that the width dimension of the leads face the neutral point of the array.

FIG. 6 is a side cross-sectional view showing an IC package according to the present invention assembled on a printed circuit card by conventional surface mount methods. Assembly is represented at an elevated operating temperature. IC package (30) comprises an integrated circuit chip (32), internal conductive wiring (34) interconnecting chip (32) to a plurality of I/O pads (36). IC package (30) is joined to a printed circuit card (38) which comprises conductive wiring (40), and a plurality of pads (42). Each connection of package (30) to the card (38) comprises a flat or rectangular shaped interconnection element (44 or 45), and a pair of solder joints, top solder joints (46 and 47) joining the IC package I/O pad (36) to the connecting element (44 or 45), bottom solder joints (48 and 49) joining the card pad (42) to the connecting element (44 or 45). Arrows A represent schematically the amount and direction of thermal deformation or expansion of the IC package (30) due to the effects of the operation temperature. Arrows B represent the amount of deformation and expansion of the printed circuit card (42) resulting from the effects of a temperature change. Arrows B are larger than arrows A, indicating that in this illustrative example, circuit card (42) has a higher amount of thermal expansion than the package (30), thereby causing deformation of interconnection elements (44) located in peripheral regions of the package. However, because of the specific shape and orientation of interconnection elements (44) (as previously described with respect to FIGS. 4 and 5), the deformation in the elements (44) is in the direction perpendicular to thickness of the element and not its width, and thereby the stress in the solder joints (46 and 48) are maintained to a relatively low level not resulting in permanent damage to the package.

As the neutral point of the IC package (30) is approached from positions towards the outside edges or periphery of package (30), the amount of thermally induced deformation becomes smaller and smaller. Consequently, for the more central area of package (30), it may be that it is not essential to overcome the adverse affects of differences in thermal expansion to have the leads face the center of the module, but the leads could be oriented and arranged in any manner with respect to the neutral point without appreciable decrease in reliability resulting from the thermally induced deformation.

In order to achieve these goals, it is seen from the above that the shape of the connection elements is important. The material composition of the connecting elements is also significant. Leads must be made of a material with suitable compliance. It is also advantageous to use a lead material that has a thermal expansion coefficient that is similar to that of the package to which the lead is attached. Typically leads comprised of alloys of nickel and iron or nickel, iron and cobalt provide sufficient compliance. In particular, if the IC package is a ceramic package, leads made of an alloy of 42% nickel, 58% iron has been found to be appropriate. Another material found appropriate for leads for ceramic packages is an alloy of 54% iron, 29% nickel and 17% cobalt, commercially known as Kovar.

The rectangular shaped connection elements as shown in FIG. 6 can be constructed from sheet metal using conventional stamping or other well known methods. Appropriate surface finishes can be applied to the connecting elements using standard plating or inlay cladding methods.

Figure 7:
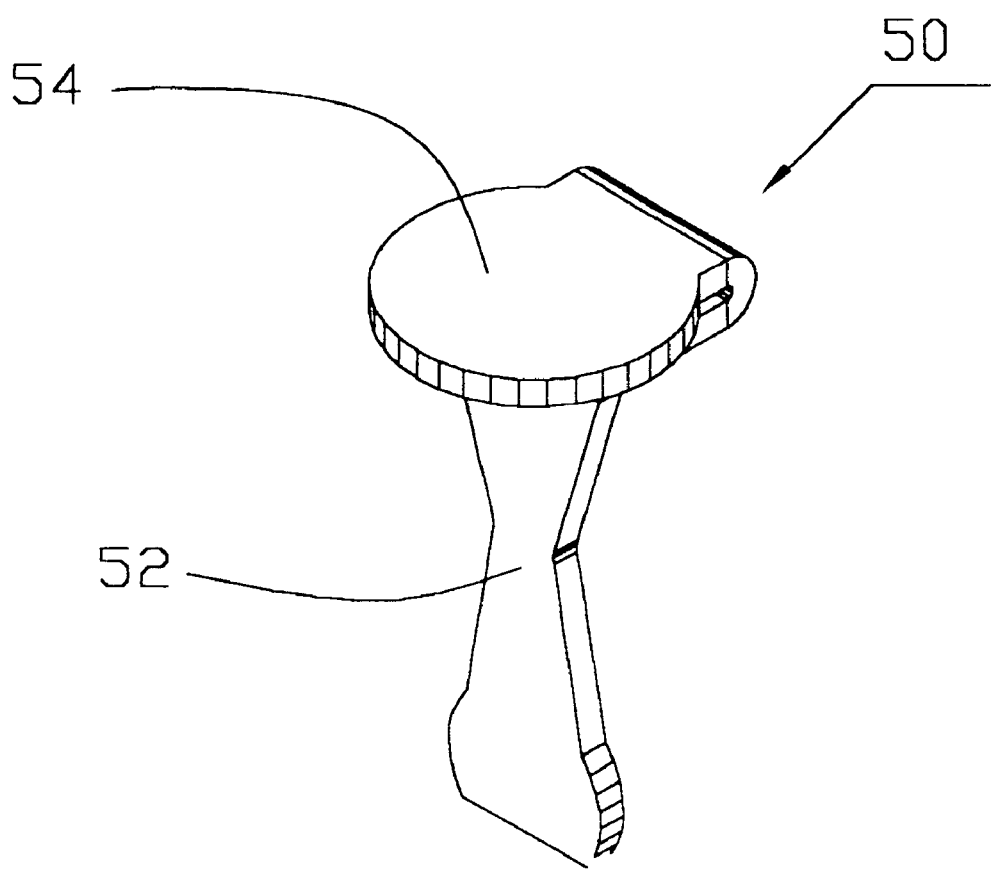
FIG. 7 is an isometric view showing a flat connection element showing further features of the present invention.

One preferred way of fabricating the leads is to stamp the appropriate shape from a flat metal sheet, and then fold it, for example, partially upon itself, into an appropriate form as shown in FIG. 7. Illustrated element (50) comprises a flat, rectangular shaped arm (52), and a flat pad (54). The width dimension of flat arm (52) is shown as being greater than the thickness dimension. As can be seen from FIG. 7, the width of the flat arm (52) need not be constant throughout its length as it can be narrower at the middle, thereby offering optimal thermal stress distribution. This results in minimum reaction force by the connecting element resulting from thermal expansion and consequently minimum stress to the joint. Lead (50) of a shape as shown in FIG. 7 also has the advantage of vertical and horizontal symmetry in that the projection of flat rectangular arm (52) intersects the flat pad portion (54) in its center such that the width of the contact pad portion (54) on both sides of the projection of the central portion of flat arm (52) is similar. Thus it is seen that each lead is configured such that the projection of the substantially flat rectangular cross-section portion of each lead intersects the contact portion of that lead such that the intersection is symmetrical on the contact portion.

Flat arm (52) of the element (50) of FIG. 7 has a straight vertical shape for connecting to the solder joint of the printed circuit card. The lead (50) could thus have an end portion that has a wider dimension than the remainder of the flat lead. With this shape, solder fillet solidifies with a meniscus shape, that has no sharp angle, thereby avoiding any stress concentration zone in the connections to the printed circuit card.

In another embodiment, leads can also have an additional bend near the bottom tip of the flat arm, to provide a second flat contact pad, that can be used to facilitate the assembly of the package on the printed circuit card. Other variations from the embodiment of FIG. 7 are possible while still obtaining the advantages cited above. For example, flat arm can be curved in a plane perpendicular to the flat portion. Flat arm can also be at an angle from the vertical, this way some pitch variation can be obtained and card pad array can be slightly less dense than the corresponding IC package pad array.

The described interconnection system could also be used to interconnect two different printed circuit board assemblies together. First printed circuit assembly could have, on its surface, any combination of prepackaged integrated circuits, bare semiconductor dies, or discrete components. This first printed circuit board comprises of an array of metallized pads, onto which a plurality of leads as described is attached in the same array configuration. Then, the first circuit assembly can be interconnected to a second printed circuit board assembly, using the array of connecting devices as described and appropriate surface mount assembly method.

The above Figures of the drawings and accompanying description are provided for illustrative purposes only of preferred embodiments of the invention. The invention is not intended to be limited to the exact shape, number of pads or connection elements or the nature of materials shown or described, as variations in the shown and described aspects of the invention would be apparent to those skilled in the art. It will be appreciated by those skilled in the art that the present invention can be embodied in forms other than the specific forms provided herein without departing from the spirit or scope of the present invention.

What is claimed is:

1. An integrated circuit package comprising:
    an array of contacts on a surface of the package, said array of contacts having a neutral point;
    a plurality of compliant leads such that each lead is connected to one of said contacts on the surface of the package;
    each lead extending outwardly from a respective contact on said surface and having a generally rectangular cross-section shape such that each lead has a width dimension and a thickness dimension such that the width dimension is greater than the thickness dimension; and
    wherein all of the leads are arranged and oriented around the neutral point of said array such that the width dimension of all of the leads face the neutral point.

2. An integrated circuit package of claim 1, wherein each lead is positioned generally perpendicular to the surface of the package.

3. An integrated circuit package of claim 2, wherein each lead further comprises a contact portion generally parallel to the surface of the package and each said contact portion is attached to one of the contacts of said array of contacts.

4. An integrated circuit package of claim 3, wherein each lead is made of electrically conductive material and said material is folded to form the contact portion.

5. An integrated circuit package of claim 4 wherein said electrically conductive material is selected from an alloy of nickel and iron and an alloy of iron, nickel and cobalt.

6. An integrated circuit package of claim 3, wherein the contact portion of each lead is positioned generally perpendicular to a remaining portion of the lead.

7. An integrated circuit package of claim 6, wherein each lead is configured such that the projection of the remaining portion of each lead intersects the contact portion of that lead such that the intersection is symmetrical on the contact portion.

8. An integrated circuit package according to claim 1, wherein each lead has an end portion which has a greater width dimension than the width dimension of the remaining portion of the lead.

9. An electronic circuit assembly comprising:
    a first planar component having an array of contacts on one surface thereof such that said array of contacts has a neutral point;
    a second planar component having an array of contacts on one surface thereof such that said array of contacts on the surface of the second planar component correspond to the contacts in said array of contacts on the surface of the first planar component;
    a plurality of compliant leads such that each contact on the surface of the first planar component is Interconnected by a compliant lead to a corresponding contact on the surface of the second planar component;
    each compliant lead having a generally rectangular cross-section shape such that each lead has a width dimension and a thickness dimension such that the width dimension Is greater than the thickness dimension; and
    wherein all of said compliant leads are arranged and oriented between the contacts on said surfaces of the fist and second planar components around said neutral point such that the width dimension of all of said compliant leads face said neutral point.

10. The electronic circuit assembly of claim 9 wherein each lead further comprises a contact portion which is positioned generally perpendicular to a remaining portion of this lead, and said contact portion is connected to a contact on the surface of one of said components.

11. The electronic circuit assembly of claim 10, wherein each lead is made of electrically conductive material and said material is folded to form the contact portion.

12. The electronic circuit assembly of claim 11 wherein said electrically conductive material is selected from an alloy of nickel and iron and an alloy of iron, nickel and cobalt.

13. The electronic circuit assembly of claim 10 wherein, each lead is configured such that the projection of the remaining portion of each lead intersects the contact portion of that lead such that the intersection is symmetrical on the contact portion.

14. The electronic circuit assembly of claim 10 wherein each said remaining portion of each lead has an end portion which has a greater width dimension than the width dimension of the remaining portion of the lead and each said end portion of the lead is connected to a contact on the surface of the component other than the component to which the corresponding contact portion of the lead is connected.

* * * * *